United States Patent
Azadet et al.

(10) Patent No.: US 8,831,133 B2
(45) Date of Patent: Sep. 9, 2014

(54) RECURSIVE DIGITAL PRE-DISTORTION (DPD)

(71) Applicant: LSI Corporation, Milpitas, CA (US)

(72) Inventors: Kameran Azadet, Pasadena, CA (US); Albert Molina, Novelda (ES)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 13/661,357

(22) Filed: Oct. 26, 2012

(65) Prior Publication Data

US 2013/0114762 A1 May 9, 2013

Related U.S. Application Data

(60) Provisional application No. 61/552,242, filed on Oct. 27, 2011.

(51) Int. Cl.
| | |
|---|---|
| *H04L 27/00* | (2006.01) |
| *H04L 27/233* | (2006.01) |
| *H04L 25/03* | (2006.01) |
| *H04B 1/04* | (2006.01) |
| *H04L 1/00* | (2006.01) |
| *G06F 5/01* | (2006.01) |
| *H04L 25/02* | (2006.01) |
| *G06F 9/30* | (2006.01) |
| *H03M 3/00* | (2006.01) |
| *H04B 1/62* | (2006.01) |

(52) U.S. Cl.
CPC .............. *G06F 5/01* (2013.01); *H04L 27/2334* (2013.01); *H04L 25/03178* (2013.01); *H04B 1/0475* (2013.01); *H04L 1/0054* (2013.01); *H04L 25/02* (2013.01); *G06F 9/3001* (2013.01); *H03M 3/30* (2013.01); *H04B 1/62* (2013.01)
USPC ............................ 375/296; 375/295; 375/297

(58) Field of Classification Search
USPC ......................................................... 375/295
See application file for complete search history.

(56) References Cited

U.S. PATENT DOCUMENTS

| | | | |
|---|---|---|---|
| 7,471,739 B1 * | 12/2008 | Wright | 375/297 |
| 2006/0240786 A1 * | 10/2006 | Liu | 455/114.3 |

* cited by examiner

*Primary Examiner* — Erin File
(74) *Attorney, Agent, or Firm* — Ryan, Mason & Lewis, LLP

(57) ABSTRACT

Recursive digital pre-distortion (DPD) techniques are provided. Digital pre-distortion is performed by applying a signal to a recursive system to generate a state vector; providing the state vector as a feedback value to the recursive non-linear system; and applying the state vector to a second function to generate an output signal, wherein at least one of the recursive system and the second function comprise a non-linear function. The recursive non-linear system can be initialized to a known initial value. The recursive system is defined by a system of non-linear differential equations.

18 Claims, 4 Drawing Sheets

RECURSIVE DIGITAL PRE-DISTORTION (DPD)

CROSS-REFERENCE TO RELATED APPLICATIONS

The present application claims priority to U.S. Patent Provisional Application Ser. No. 61/552,242, filed Oct. 27, 2011, entitled "Software Digital Front End (SoftDFE) Signal Processing and Digital Radio," incorporated by reference herein.

FIELD OF THE INVENTION

The present invention is related to digital signal processing techniques and, more particularly, to techniques for digital pre-distortion in transmitters.

BACKGROUND OF THE INVENTION

Digital pre-distortion (DPD) is a technique used to linearize a power amplifier in a transmitter to improve the efficiency of the power amplifier. A power amplifier in a transmitter typically must be substantially linear, so that a signal is accurately reproduced. Compression of the input signal or a non-linear relationship between the input signal and output signal causes the output signal spectrum to spill over into adjacent channels, causing interference.

A digital pre-distortion circuit inversely models the gain and phase characteristics of the power amplifier and, when combined with the amplifier, produces an overall system that is more linear and reduces distortion that would otherwise be caused by the power amplifier. An inverse distortion is introduced into the input of the amplifier, thereby reducing any non-linearity the amplifier might otherwise have.

Digital pre-distortion is typically implemented based on a Volterra series (e.g., memory polynomials or generalized memory polynomials). The complexity of these DPD algorithms increases exponentially with the memory depth of the non-linear model, and also puts constraints on how deep in time the model can be practically constructed. Performance is thus limited as this type of model only performs partial linearization. While such Volterra-based DPD techniques effectively linearize a power amplifier, they suffer from a number of limitations, which if overcome, could further reduce the complexity and improve the performance of DPD systems. A need therefore exists for improved digital pre-distortion techniques that further reduce the complexity of Volterra approximations without impairing performance.

SUMMARY OF THE INVENTION

Generally, recursive digital pre-distortion (DPD) techniques are provided. According to one aspect of the invention, digital pre-distortion is performed by applying a signal to a recursive system to generate a state vector; providing the state vector as a feedback value to the recursive non-linear system; and applying the state vector to a second function to generate an output signal, wherein at least one of the recursive system and the second function comprise a non-linear function. The recursive non-linear system can be initialized to a known initial value.

The recursive system is defined by a system of non-linear differential equations. For example, an exemplary system of non-linear differential equations can be expressed as follows:

$S(n) = f(S(n-1), x(n))$, and $y(n) = g(S(n))$ where x(n) is the input signal; y(n) is the output signal; f and g are non-linear functions (determined, for example, by a digital pre-distortion parameter estimation phase) and S(n) is a State space signal.

A more complete understanding of the present invention, as well as further features and advantages of the present invention, will be obtained by reference to the following detailed description and drawings.

DETAILED DESCRIPTION

Aspects of the present invention provide improved digital pre-distortion techniques with reduced complexity of Volterra approximations without impairing performance. Digital pre-distortion is traditionally implemented using non-recursive (feed-forward) solutions such as Volterra series. Aspects of the present invention recognize that for an infinite impulse response (IIR), a recursive model achieves lower complexity (in a similar manner to IIR relative to FIR filters) and improved performance as an infinite impulse can be approximated. The disclosed DPD scheme approximates the inverse of the power amplifier response using a system of non-linear differential equations of State Space variables and input signal.

The present invention can be applied in handsets, base stations and other network elements.

Figure 1:
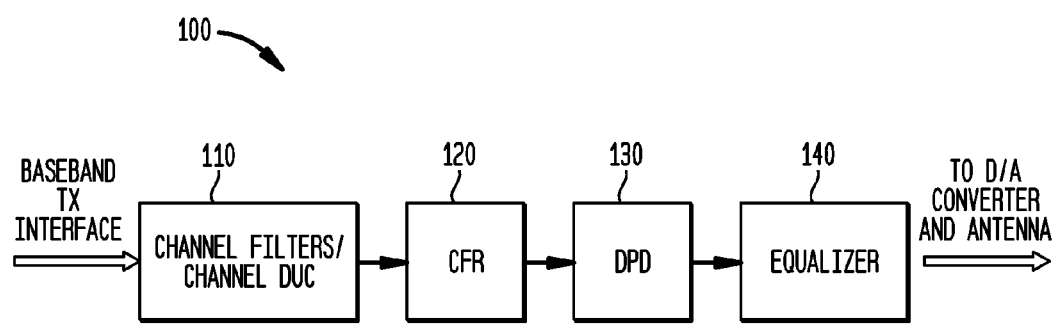
FIG. 1 illustrates portions of an exemplary transmitter in which aspects of the present invention may be employed.

FIG. 1 illustrates portions of an exemplary transmitter 100 in which aspects of the present invention may be employed. As shown in FIG. 1, the exemplary transmitter portion 100 comprises a channel filter and digital up conversion (DUC) stage 110, a crest factor reduction (CFR) stage 120, a digital pre-distortion (DPD) stage 130 and an optional equalization stage 140. Generally, the channel filter and digital up conversion stage 110 performs channel filtering using, for example finite impulse response (FIR) filters and digital up conversion to convert a digitized baseband signal to an intermediate frequency (IF). The crest factor reduction stage 120 limits the peak-to-average ratio (PAR) of the transmitted signal. The digital pre-distortion stage 130 linearizes the power amplifier to improve efficiency. The equalization stage 140 employs RF channel equalization to mitigate channel impairments.

Figure 2:
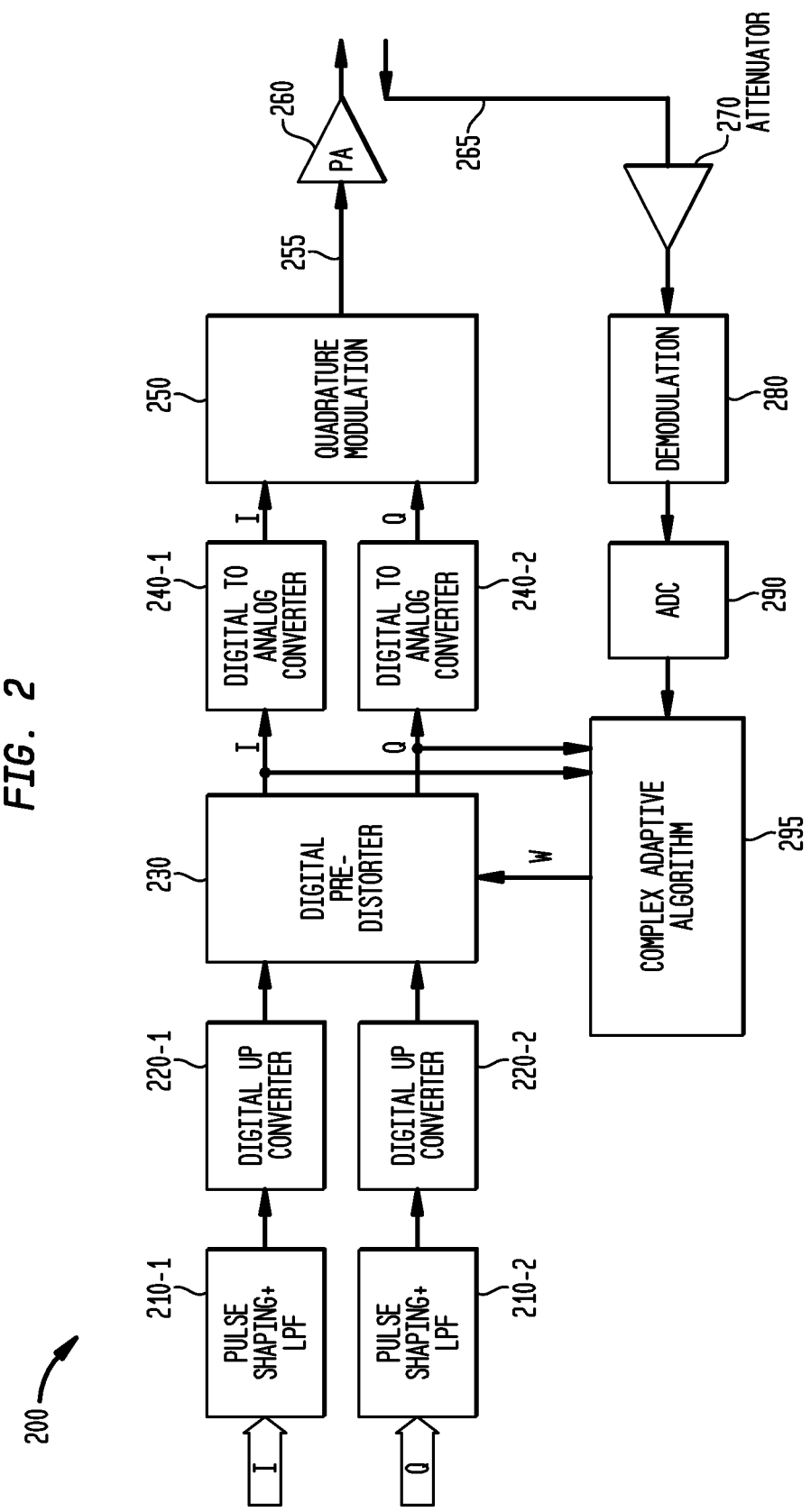
FIG. 2 illustrates portions of an alternate exemplary transmitter in which aspects of the present invention may be employed.

FIG. 2 illustrates portions of an alternate exemplary transmitter 200 in which aspects of the present invention may be employed. As shown in FIG. 2, the exemplary transmitter portion 200 comprises two pulse shaping and low pass filter (LPF) stages 210-1, 210-2 and two digital up-converters 220-1, 220-2 which process a complex signal I, Q. The exemplary transmitter portion 200 of FIG. 2 does not include the crest factor reduction stage 120 of FIG. 1, but a CFR stage could optionally be included. The complex input (I,Q) is then applied to a digital pre-distorter 230 of FIG. 2 and is the focus of the exemplary embodiment of the invention. The digital pre-distorter 230 of FIG. 2 is discussed further below, for example, in conjunction with FIGS. 3 and 4.

The output of the digital pre-distorter 230 is applied in parallel to two digital to analog converters (DACs) 240-1, 240-2, and the analog signals are then processed by a quadrature modulation stage 250 that further up converts the signals to an RF signal.

The output 255 of the quadrature modulation stage 250 is applied to a power amplifier 260, such as a Doherty amplifier or a drain modulator. As indicated above, the digital pre-distorter 230 linearizes the power amplifier 260 to improve the efficiency of the power amplifier 260 by extending its linear range to higher transmit powers.

In a feedback path 265, the output of the power amplifier 260 is applied to an attenuator 270 before being applied to a demodulation stage 280 that down converts the signal to baseband. The down converted signal is applied to an analog to digital converter (ADC) 290 to digitize the signal. The digitized samples are then processed by a complex adaptive algorithm 295 that generates parameters w for the digital pre-distorter 230. The complex adaptive algorithm 295 is outside the scope of the present application. Known techniques can be employed to generate the parameters for the digital pre-distorter 230.

A digital pre-distorter 230 can be implemented as a non-linear filter using a Volterra series model of non-linear systems. The Volterra series is a model for non-linear behavior in a similar manner to a Taylor series. The Volterra series differs from the Taylor series in its ability to capture "memory" effects. The Taylor series can be used to approximate the response of a non-linear system to a given input if the output of this system depends strictly on the input at that particular time. In the Volterra series, the output of the non-linear system depends on the input to the system at other times. Thus, the Volterra series allows the "memory" effect of devices such as capacitors and inductors to be captured.

Generally, a causal system with memory can be expressed as:

$$y(t) = \int_{-\infty}^{\infty} h(\tau) x(t-\tau) d\tau$$

In addition, a non-linear system without memory can be expressed as:

$$y(t) = \sum_{k=1}^{\infty} a_k [x(t)]^k$$

A Volterra can be considered as a combination of the two:

$$y(t) = \sum_{k=1}^{K} y_k(t)$$

$$y_k(t) = \int_{-\infty}^{\infty} \cdots \int_{-\infty}^{\infty} h_k(\tau_1, \ldots, \tau_k) x(t-\tau_1) \ldots x(t-\tau_k) d\tau_1 \ldots d\tau_k$$

In the discrete domain, the Volterra Series can be expressed as follows:

$$y(n) = \sum_{k=1}^{K} y_k(n)$$

$$y_k(n) = \sum_{m_1=0}^{M-1} \cdots \sum_{m_1=0}^{M-1} h_k(m_1, \ldots, m_k) \prod_{l=1}^{k} x(n-m_l)$$

The complexity of a non-recursive Volterra series can grow exponentially. Aspects of the present invention recognize that for an infinite impulse response (IIR), a recursive model achieves lower complexity (in a similar manner to IIR relative to FIR filters) and improved performance as an infinite impulse can be approximated. The disclosed DPD scheme approximates the inverse of the power amplifier response using a system of non-linear differential equations of State Space variables and input signal.

Volterra series are to a non-linear system what finite impulse response (FIR) filters are to linear systems. An FIR implementation can be complex and require a large number of taps. In a simple case, a first order system can produce an infinite impulse response (IIR). Hence, for an IIR implementation, only one multiplier is required (as a first order system). An FIR implementation of the same trivial first order system, however, would require an infinite number of taps in theory and a large number of taps in practice. An IIR implementation has significantly reduced complexity than an FIR implementation in this case. Aspects of the present invention extend Volterra implementations for digital pre-distortion using a recursive system of non-linear differential equations of State Space variables and input signal.

Figure 3:
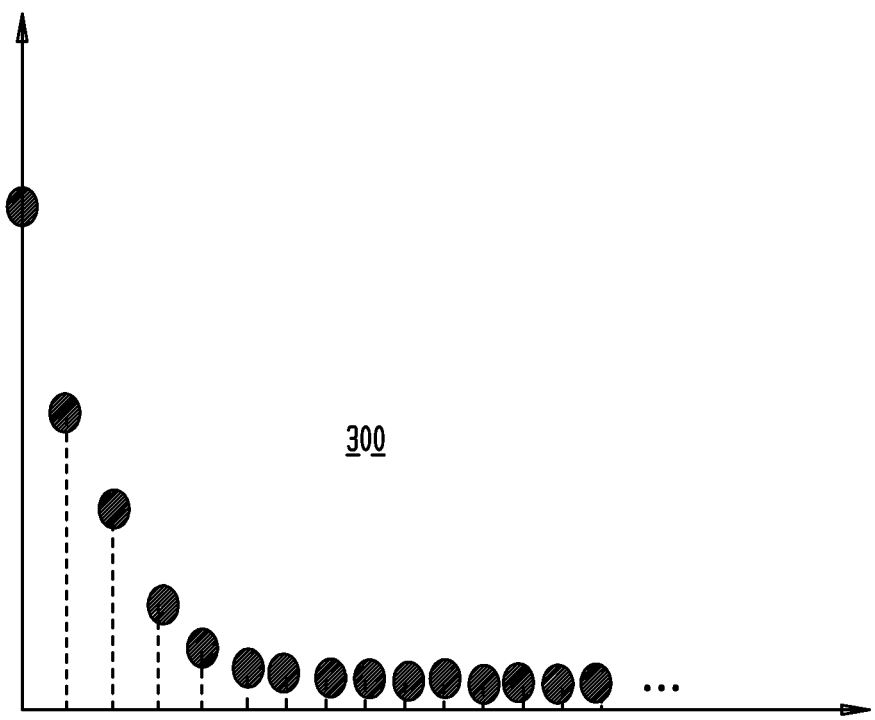
FIG. 3 illustrates a frequency response for an exemplary first order resistive-capacitive (RC) system.

FIG. 3 illustrates a frequency response 300 for an exemplary first order resistive-capacitive (RC) system.

A recursive non-linear system with memory can be expressed by the following non-linear differential equations as follows:

$$\frac{dS}{dt}(t) = f(S(t), x(t))$$

$$y(t) = g(S(t))$$

where x(t) is the input signal (a scalar); S(t) is the State space signal (a vector); Y(t) is the output signal (a scalar) and f and g are non-linear functions.

In the discrete time domain, the non-linear differential equations can be expressed as a recursive solution to the differential equations as follows (Euler approximation):

$$S(n)-S(n-1)=h \cdot f(S(n),x(n))$$

$$y(n)=g(S(n))$$

where $$S(n)=f(S(n-1),x(n)),$$

$$y(n)=g(S(n)).$$

Figure 4:
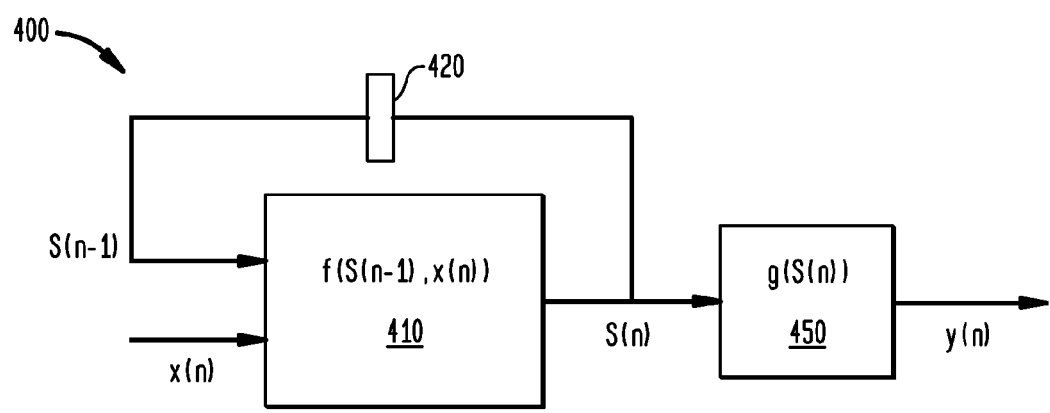
FIG. 4 is a schematic block diagram of an exemplary recursive digital pre-distortion system incorporating aspects of the present invention.

FIG. 4 is a schematic block diagram of an exemplary recursive digital pre-distortion system 400 incorporating aspects of the present invention. The exemplary recursive digital pre-distortion system 400 can be implemented in hardware or software, as would be apparent to a person of ordinary skill in the art. As shown in FIG. 4, the recursive digital pre-distortion system 400 comprises a recursive system of non-linear differential equations of State Space variables S(n) and the input signal x(n). The exemplary recursive digital pre-distortion system 400 comprises a first stage 410 embodied as a first order system with a feedback having a memory element 420 and a second stage 450 embodied as a first order system without feedback. The input signal x(n) is applied to the first stage 410 together with the feedback state vector S(n−1). The state vector S(n) is also applied to the second stage. The state vector S(n) is initialized by setting it to 0. It is again noted that f and g are multi-dimensional non-linear functions determined by the digital pre-distortion parameter estimation phase. For example, $$S(n)=[S_1(n),S_2(n),S_3(n)]$$

$$g(S(n))=[g_1(S_1(n)),g_2(S_2(n)),g_3(S_3(n))]$$

For a more detailed discussion of digital pre-distortion parameter estimation, see, for example, International Patent Application Serial No. PCT/US12/62179, entitled "Software Digital Front End (SoftDFE) Signal Processing," filed Oct. 26, 2012, and incorporated by reference herein.

CONCLUSION

While exemplary embodiments of the present invention have been described with respect to digital logic blocks and memory tables within a digital processor, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit or micro-controller. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, wherein, when the program code is loaded into and executed by a machine, such as a processor, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital processor, a microprocessor, and a micro-controller.

It is to be understood that the embodiments and variations shown and described herein are merely illustrative of the principles of this invention and that various modifications may be implemented by those skilled in the art without departing from the scope and spirit of the invention.

We claim:

1. A digital pre-distortion method, comprising:
   applying a signal to a recursive system to generate a state vector;
   providing said state vector as a feedback value to said recursive system; and
   applying said state vector to a second function to generate an output signal, wherein at least one of said recursive system and said second function comprise a non-linear function.

2. The method of claim 1, wherein said recursive system is defined by a system of non-linear differential equations.

3. The method of claim 2, wherein said system of non-linear differential equations comprises:

$$S(n)=f(S(n-1),x(n)), \text{ and}$$

$$y(n)=g(S(n))$$

where x(n) is the input signal; y(n) is the output signal; f and g are non-linear functions and S(n) is a State space signal.

4. The method of claim 3, wherein said non-linear functions f and g are determined by a digital pre-distortion parameter estimation phase.

5. The method of claim 1, further comprising the step of initializing said recursive system.

6. The method of claim 1, wherein said state vector is initialized to a known initial value.

7. A digital pre-distortion system, comprising:
   a memory; and
   at least one hardware device, coupled to the memory, operative to:
   apply a signal to a recursive system to generate a state vector;
   provide said state vector as a feedback value to said recursive system; and
   apply said state vector to a second function to generate an output signal, wherein at least one of said recursive system and said second function comprise a non-linear function.

8. The digital pre-distortion system of claim 7, wherein said recursive system is defined by a system of non-linear differential equations.

9. The digital pre-distortion system of claim 8, wherein said system of non-linear differential equations comprises:

$$S(n)=f(S(n-1),x(n)), \text{ and}$$

$$y(n)=g(S(n))$$

where x(n) is the input signal; y(n) is the output signal; f and g are non-linear functions and S(n) is a State space signal.

10. The digital pre-distortion system of claim 9, wherein said non-linear functions f and g are determined by a digital pre-distortion parameter estimation phase.

11. The digital pre-distortion system of claim 7, further comprising the step of initializing said recursive system.

12. The digital pre-distortion system of claim 7, wherein said state vector is initialized to a known initial value.

13. A digital pre-distortion system, comprising:
   a recursive first order system having feedback that processes an input signal x(n) to generate a state vector S(n) that is provided as a feedback value to said recursive first order system; and
   a second first order system without feedback to process said state vector S(n) using a second function to generate an output signal y(n), wherein at least one of said recursive first order system and said second function comprise a non-linear function.

14. The digital pre-distortion system of claim 13, wherein said recursive first order system is defined by a system of non-linear differential equations.

15. The digital pre-distortion system of claim 14, wherein said system of non-linear differential equations comprises:

$$S(n)=f(S(n-1),x(n)), \text{ and}$$

$$y(n)=g(S(n))$$

where x(n) is the input signal; y(n) is the output signal; f and g are non-linear functions and S(n) is a State space signal.

16. The digital pre-distortion system of claim 15, wherein said non-linear functions f and g are determined by a digital pre-distortion parameter estimation phase.

17. The digital pre-distortion system of claim 13, further comprising the step of initializing said recursive first order system.

18. The digital pre-distortion system of claim 13, wherein said state vector is initialized to a known initial value.

* * * * *